(12) United States Patent
Mochizuki

(10) Patent No.: US 10,404,656 B2
(45) Date of Patent: Sep. 3, 2019

(54) ANTENNA SYSTEM

(71) Applicant: NEC CORPORATION, Tokyo (JP)

(72) Inventor: Takuji Mochizuki, Tokyo (JP)

(73) Assignee: NEC Corporation, Tokyo (JP)

(*) Notice: Subject to any disclaimer, the term of this patent is extended or adjusted under 35 U.S.C. 154(b) by 186 days.

(21) Appl. No.: 15/514,026

(22) PCT Filed: Mar. 16, 2015

(86) PCT No.: PCT/JP2015/001430
§ 371 (c)(1),
(2) Date: Mar. 24, 2017

(87) PCT Pub. No.: WO2016/047005
PCT Pub. Date: Mar. 31, 2016

(65) Prior Publication Data
US 2017/0302621 A1 Oct. 19, 2017

(30) Foreign Application Priority Data
Sep. 25, 2014 (JP) .................................. 2014-195176

(51) Int. Cl.
*H04L 29/06* (2006.01)
*H04L 29/12* (2006.01)
(Continued)

(52) U.S. Cl.
CPC .......... *H04L 61/2076* (2013.01); *H01Q 1/02* (2013.01); *H01Q 1/405* (2013.01); *H01Q 1/42* (2013.01);
(Continued)

(58) Field of Classification Search
CPC .................................................. H04L 41/2076
See application file for complete search history.

(56) References Cited

U.S. PATENT DOCUMENTS

2006/0285480 A1 12/2006 Janofsky
2007/0053167 A1 3/2007 Ueda
(Continued)

FOREIGN PATENT DOCUMENTS

EP 1 737 065 12/2006
EP 1 777 551 4/2007
(Continued)

OTHER PUBLICATIONS

Extended European Search Report dated May 15, 2018, by the European Patent Office in counterpart European Patent Application No. 15843983.6.
(Continued)

*Primary Examiner* — Adnan M Mirza
(74) *Attorney, Agent, or Firm* — Finnegan, Henderson, Farabow, Garrett & Dunner, L.L.P.

(57) ABSTRACT

[Problem] To provide an antenna system that excellently dissipates heat to the outside of a housing, said heat having been generated by means of an electronic component. [Solution] An electronic circuit board 10 has an electronic component mounted thereon, and has an antenna that is formed on one surface. A protection member 20 covers the one surface of the electric circuit board 10. A heat transfer unit 30 transfers heat to the protection member 20, said heat having been generated by means of the electronic component mounted on the electric circuit board 10.

9 Claims, 17 Drawing Sheets

(51) Int. Cl.
    *H01Q 1/42*     (2006.01)
    *H01Q 23/00*     (2006.01)
    *H05K 7/20*     (2006.01)
    *H04L 12/24*     (2006.01)
    *H01Q 1/02*     (2006.01)
    *H01Q 1/40*     (2006.01)
    *H01Q 9/04*     (2006.01)

(52) U.S. Cl.
    CPC ........... *H01Q 9/0414* (2013.01); *H01Q 23/00* (2013.01); *H04L 41/0213* (2013.01); *H04L 41/082* (2013.01); *H05K 7/20* (2013.01)

(56) References Cited

U.S. PATENT DOCUMENTS

2008/0062038 A1    3/2008    Ouchi et al.
2014/0062808 A1*    3/2014    Kataoka ................... H01Q 1/32
                                            343/713

FOREIGN PATENT DOCUMENTS

| EP | 1 898 231 | 3/2008 |
|---|---|---|
| JP | 2000-56008 | 2/2000 |
| JP | 2002-211222 | 7/2002 |
| JP | 2003-158465 | 5/2003 |
| JP | 2004-20514 | 1/2004 |
| JP | 2004-179257 | 6/2004 |
| JP | 2005-191874 | 7/2005 |
| JP | 2007-37100 | 2/2007 |
| JP | 2007-73849 | 3/2007 |
| JP | 2008-64632 | 3/2008 |
| JP | 2011-114710 | 6/2011 |
| JP | 2014-50029 | 3/2014 |
| JP | 2014-82701 | 5/2014 |

OTHER PUBLICATIONS

Notification of Reasons for Refusal issued by Japanese Patent Office in counterpart Japanese Patent Application No. 2016-549898, dated Jan. 9, 2018.
International Search Report and Written Opinion dated Jun. 2, 2015, in corresponding PCT International Application.

* cited by examiner

ANTENNA SYSTEM

CROSS-REFERENCE TO RELATED PATENT APPLICATIONS

This application is a National Stage Entry of International Application No. PCT/JP2015/001430, filed Mar. 16, 2015, which claims priority from Japanese Patent Application No. 2014-195176, filed Sep. 25, 2014. The entire contents of the above-referenced applications are expressly incorporated herein by reference.

TECHNICAL FIELD

The present invention relates to an antenna system on which an electronic component is mounted.

BACKGROUND ART

In an antenna integrated transceiver in which a transceiver is disposed so as to be adjacent to an antenna, in general, the transceiver is disposed at a rear side (hereinafter, referred to as a back side) of the antenna that is opposite to a radio wave radiation side of the antenna.

In order to achieve high speed communication or the like, when a higher frequency radio wave is used for transmission and reception, the communication capacity has to be expanded by performing directivity control using a beam forming technology, improving a transmission/reception gain, and performing interference avoidance control. In this case, it is necessary to decrease an area per antenna element and a distance between the antenna elements in an array antenna composed of a plurality of antenna elements that face in a radio wave radiation direction. Further, there is a case in which many transceivers are disposed in parallel to realize MultiUser-MIMO (Multiple-Input and Multiple-Output) of a wireless transmission stream by using simultaneous multiple access. Accordingly, many electric circuits are disposed at a high density and whereby, heat is generated by an electronic component included in these electric circuits in a small area.

In patent literature 1, there is described an antenna device in which heat generated by an electronic component included in an electric circuit for transmission and reception is radiated from an upper lid and a lower lid of a cylindrical radome that is a housing for covering an antenna via a reflection board used for adjusting a directivity of the radio wave radiated from the antenna.

In patent literature 2, there is described a portable terminal device in which heat generated by an electronic component is transferred to an antenna, the heat is radiated in the housing, and a part of the heat is radiated to the outside.

In patent literature 3, there is described an antenna integrated device having a structure in which heat generated by an electronic component included in an electric circuit for transmission and reception is radiated to the back side of the antenna.

CITATION LIST

Patent Literature

[patent literature 1] Japanese Patent Application Laid-Open No. 2014-82701
[patent literature 2] Japanese Patent Application Laid-Open No. 2005-191874
[patent literature 3] Japanese Patent Application Laid-Open No. 2003-158465

SUMMARY OF INVENTION

Technical Problem

The device described in patent literature 1 and the device described in patent literature 2 have a problem in which the temperature inside the housing of the device increases by heat generated by the electronic component. Besides, when the volume inside the housing is increased to suppress the temperature rise inside the housing, a problem in which the size of the device increases occurs.

Further, a device described in patent literature 3 has a structure in which heat is radiated to the back side of an antenna. Accordingly, when an electric circuit is disposed on the back surface side of the antenna so as to be in close contact with each other, a problem in which it is difficult to form a heat transfer path through which heat generated near the antenna is transferred to the back side occurs.

Accordingly, an object of the present invention is to provide an antenna system that can well radiate heat generated by the electronic component to the outside of the housing.

Solution to Problem

An antenna system, according to the present invention, comprises:
an electric circuit board on which an electronic component is mounted, the electric circuit board including an antenna formed on one of surfaces of the electric circuit board;
a protection member covering the one of surfaces of the electric circuit board; and
a heat transfer part which transfers heat generated by the electronic component mounted on the electric circuit board to the protection member.

An antenna system, according to another aspect of the present invention, comprises
an electric circuit board on which an antenna is formed, the electronic circuit board having a surface on which an electronic component is mounted;
a protection member covering at least part of another surface of the electric circuit board; and
a heat transfer part which transfer heat generated by the electronic component mounted on the electric circuit board, wherein
at least part of heat generated by the electronic component is transferred to a side of the another surface via the heat transfer part and
the protection member is provided with a through hole that exposes the another surface of the electric circuit board for releasing the heat, which is transferred to the another surface, to outside.

Advantageous Effects of Invention

By using the present invention, the heat generated by the electronic component can be well radiated to the outside of the housing.

DESCRIPTION OF EMBODIMENTS

Example Embodiment 1

Figure 1:
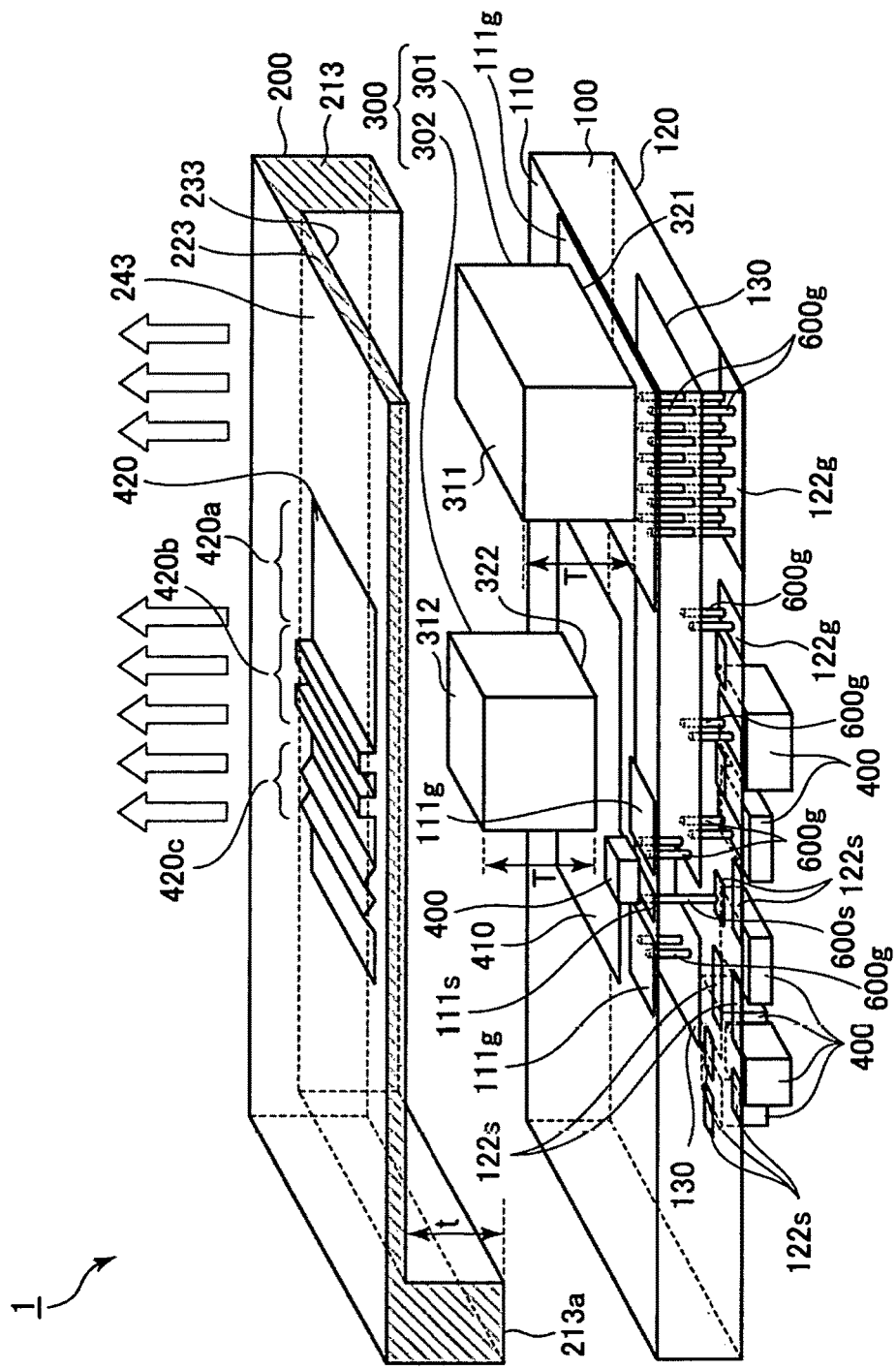
FIG. 1 is a sectional perspective view schematically showing an example of a structure of an electric circuit system according to a first example embodiment of the present invention.

An electric circuit system 1 according to a first example embodiment of the present invention will be described with reference to drawings. FIG. 1 is a sectional perspective view schematically showing an example of a structure of the electric circuit system 1 according to the first example embodiment of the present invention. As shown in FIG. 1, the electric circuit system 1 according to this example embodiment includes a board 100, a protection member 200 which covers an upper surface 110 that is one of the surfaces of the board 100, and a heat transfer member 300 via which the board 100 and the protection member 200 are thermally coupled to each other.

As shown in FIG. 1, an electric wiring pattern is formed on the upper surface 110 that is one of the surfaces of the board 100 and whereby, first layer circuits 111s and 111g are formed. Further, the electric wiring pattern is formed on a lower surface 120 that is the other surface of the board 100 and whereby, second layer circuits 122s and 122g are formed.

Each electronic component 400 such as an IC (Integrated Circuit) or the like is mounted on the upper surface 110 and the lower surface 120 of the board 100. Further, a transceiver is composed of the first layer circuits 111s and 111g, the second layer circuits 122s and 122g, and each electronic component 400. In other words, the transceiver is composed of the electric circuit system 1. It is noted that the each electronic component 400, for example, is a connector for inspection, a 2-pole double throw switch, an IC for calibration, a bandpass filter, a linear amplifier, a power amplifier, an IC for transmission and reception, an IC for baseband, or the like.

A first antenna 410 used when the transceiver transmits and receives a signal is formed on the upper surface 110 of the board 100. The first antenna 410 is electrically connected to the first layer circuit 111s, a main resonator used when the transceiver transmits and receives the signal, and for example, a patch antenna. Further, the electric circuit system 1 radiates a radio wave from the second antenna 420 in a direction in which the upper surface 110 of the board 100 faces by double resonance of the first antenna 410 and a second antenna 420 mentioned later and performs another operation and whereby, the electric circuit system 1 can transmit/receive the signal to/from a communication equipment that exists in the radio wave radiation direction.

Each of the first layer circuit 111s and the second layer circuit 122s is a circuit electrically connected to a signal line. Further, the first layer circuit 111s and the second layer circuit 122s are electrically connected to each other via a through-hole 600s. It should be noted that with respect to the circuit pattern, a line such as a signal line, a power supply line, or the like other than a ground line is collectively called a signal line.

Each of the first layer circuit 111g and the second layer circuit 122g is a circuit electrically connected to the ground line of the electric circuit system 1. Further, as shown in FIG. 1, a ground layer 130 is formed as an interlayer sandwiched between the upper surface 110 and the lower surface 120 of the board 100. The ground layer 130 is thermally coupled and electrically connected to the first layer circuit 111g and the second layer circuit 122g via a thermal via 600g.

Accordingly, the ground line of the first layer circuit 111g and the ground line of the second layer circuit 122g are thermally coupled and electrically connected to each other via the thermal via 600g and the ground layer 130. As shown in FIG. 1, a plurality of the first layer circuits 111g are formed on the upper surface 110 of the board 100 and a plurality of the second layer circuits 122g are formed on the lower surface 120. Besides, the thermal via through which a plurality of the first layer circuits 111g and the ground layer 130 are thermally coupled and electrically connected to each other and a plurality of the second layer circuits 122g and the ground layer 130 are thermally coupled and electrically connected to each other is collectively called the thermal via 600g.

As shown in FIG. 1, the heat transfer member 300 includes heat transfer members 301 and 302. Further, the heat transfer member 301 in the heat transfer member 300 is disposed on one first layer circuit 111g among a plurality of the first layer circuits 111g. Furthermore, the heat transfer member 302 in the heat transfer member 300 is disposed on the first antenna 410. Accordingly, the heat transfer members 301 and 302 are disposed on the upper surface 110 of the board 100.

As shown in FIG. 1, the heat transfer members 301 and 302 are made of resin such as rubber or the like which has a thermal conductivity higher than that of air and is formed in a rectangular parallelepiped shape. Besides, in the heat transfer members 301 and 302 disposed on the upper surface 110 of the board 100, the surfaces facing the upper surface 110 are called lower surfaces 321 and 322. Further, in the heat transfer members 301 and 302, the surfaces opposite to the lower surfaces 321 and 322 are called upper surfaces 311 and 312, respectively.

As shown in g. 1, the distance between the upper surface 311 and the lower surface 321 and the distance between the upper surface 312 and the lower surface 322 (in other words, the height of the heat transfer members 301 and 302) are represented by T.

The protection member 200 includes a leg portion 213 which makes contact with the upper surface 110 along the edge of the upper surface 110 of the board 100 and a plate-shaped portion 223 which covers the upper surface 110 together with the leg portion 213 when it is screwed to an upper surface 110 side of the board 100. The plate-shaped portion 223 has a top surface 233 that is separately located from and faces to the upper surface 110 of the board 100 and an outer surface 243 that is a surface opposite to the top surface 233 and faces to the outside. The protection member 200 is for example, a radome.

Besides, the leg portion 213 has a lower surface 213a that makes contact with the upper surface 110. Moreover, as shown in FIG. 1, the distance between the top surface 233 and the lower surface 213a is represented by t.

Further, the heat transfer members 301 and 302 and the protection member 200 are formed so as to satisfy T≥t. When this condition is satisfied, the top surface 233 makes contact with the upper surfaces 311 and 312 of the heat transfer members 301 and 302 when the protection member 200 is screwed to the upper surface 110 side of the board 100. Accordingly, the upper surface 110 of the board 100 and the protection member 200 are thermally coupled to each other via the heat transfer members 301 and 302.

The second antenna 420 used when the transceiver transmits and receives the signal is formed to the outer surface 243 of the protection member 200. The second antenna 420 is a sub resonator whose resonance frequency is equal to that of the first antenna 410 and for example, a patch antenna. Accordingly, the electric circuit system 1 can transmit/receive the signal to/from a communication equipment existing in a direction in which the outer surface 243 of the protection member 200 faces by the second antenna 420 in a wider frequency band.

Specifically, the second antenna 420 is formed for example, a metal such as aluminum, silver, copper, or the like is printed, evaporated, or embedded in a concave portion formed on the outer surface 243 of the protection member 200.

Further, a part of the outer surface 243 of the protection member 200 is formed as the second antenna 420 and the second antenna 420 may be formed in a plane shape 420a, a convexo-concave shape 420b of which the top of the convex part is flat, or a ridge shape 420c. In an example shown in FIG. 1, the second antenna 420 includes three areas: an area in which it is formed in the plane shape 420a, an area in which it is formed in the convexo-concave shape 420b, and an area in which it is formed in the ridge shape 420c. However, it is assumed that the second antenna 420 is formed in one shape among the plane shape 420a, the convexo-concave shape 420b, and the ridge shape 420c. Specifically, a part of the outer surface 243 is formed as the second antenna 420 and the second antenna 420 is formed in the plane shape 420a, the convexo-concave shape 420b, the ridge shape 420c, or the like according to a heat radiation efficiency, a signal radiation efficiency, a directivity, a time for forming the shape, and the like.

A transfer path of heat generated by each electronic component 400 will be described. The heat generated by the electronic components 400 mounted on the lower surface 120 of the board 100 is transferred to the first layer circuit 111g or the first layer circuit 111s on the upper surface 110 of the board 100 via the thermal via 600g or the through-hole 600s. It should be noted that a part of the heat generated by the electronic components 400 mounted on the lower surface 120 of the board 100 is transferred to the first layer circuit 111g on the upper surface 110 of the board 100 via the ground layer 130 and the thermal via 600g.

The heat transferred to the first layer circuit 111g in the upper surface 110 of the board 100 on which the heat transfer member 301 is disposed is transferred to the top surface 233 of the protection member 200 via the heat transfer member 301. Further, the heat transferred to the first layer circuit 111s in the upper surface 110 of the board 100 is transferred to the top surface 233 of the protection member 200 via the first antenna 410 and the heat transfer member 302.

The heat transferred to the top surface 233 is transferred to the outer surface 243 and radiated outside the electric circuit system 1. It should be noted that the heat transferred to an area on the top surface 233 that is opposite to an area on the outer surface 243 on which the second antenna 420 is disposed is transferred to the second antenna 420 and radiated outside the electric circuit system 1 from the second antenna 420.

Figure 2:
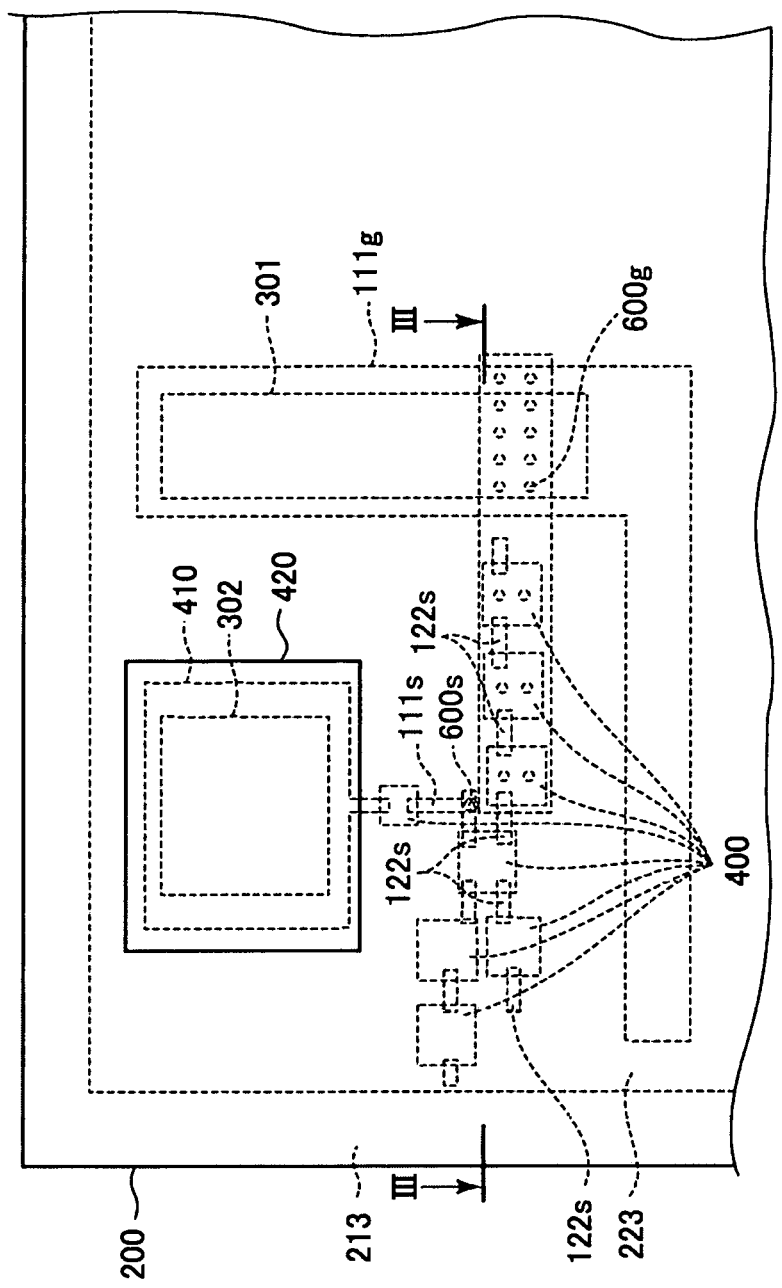
FIG. 2 is a top view of an electric circuit system according to the first example embodiment of the present invention.

FIG. 2 is a top view of the electric circuit system 1 according to the first example embodiment of the present invention. As shown in FIG. 2, the heat transfer member 301 is disposed on the first layer circuit 111g in the upper surface 110 of the board 100. Further, the heat transfer member 302 is disposed on the first antenna 410 that is disposed on the upper surface 110 of the board 100. Furthermore, the heat transfer member 302 and each electronic component 400 are thermally coupled to each other via the second layer circuit 122s, the through-hole 600s, the first layer circuit 111s, and the first antenna 410. Therefore, the heat generated by each electronic component 400 is transferred to the heat transfer member 302. Further, the heat transfer member 301 and each electronic component 400 are thermally coupled to each other via the second layer circuit 122g, the thermal via 600g, and the first layer circuit 111g. Accordingly, the heat generated by each electronic component 400 is transferred to the heat transfer member 301. Therefore, the heat generated by each electronic component 400 is transferred to the heat transfer members 301 and 302.

Then, the heat transferred to the heat transfer member 302 is transferred to the second antenna 420 via the top surface 233 of the protection member 200 and radiated outside the electric circuit system 1 from the second antenna 420. On the other hand, the heat transferred to the heat transfer member 301 is transferred to the outer surface 243 via the top surface 233 of the protection member 200 and radiated outside the electric circuit system 1 from the outer surface 243.

Figure 3:
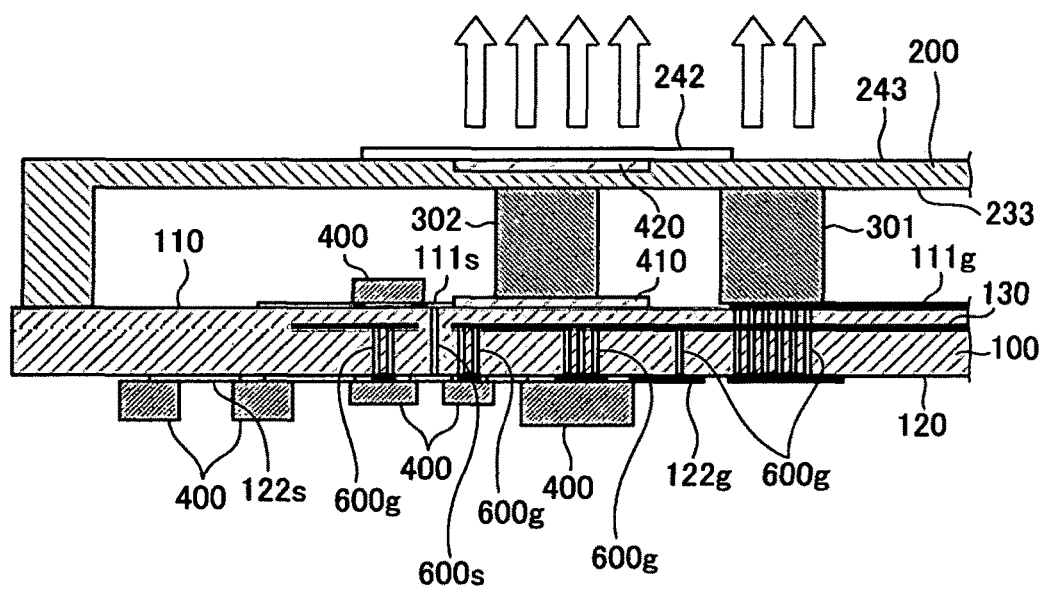
FIG. 3 is a sectional view of a main part of an electric circuit system according to the first example embodiment of the present invention.

FIG. 3 is a sectional view of a main part of the electric circuit system 1 according to the first example embodiment of the present invention. FIG. 3 shows a cross-section along a line III-III in FIG. 2. As shown in FIG. 3, the electronic component 400 is mounted on the upper surface 110 and the lower surface 120 of the board 100. Further, the first antenna 410 is disposed on the upper surface 110 of the board 100 and the second antenna 420 is disposed on the outer surface 243 of the protection member 200.

Accordingly, in the electric circuit system 1 according to this example embodiment, the radio wave is radiated by the first antenna 410 and the second antenna 420 in a direction in which the upper surface 110 of the board 100 faces.

Further, as shown in FIG. 3, a protection layer 242 is formed on an area in the outer surface 243 of the protection member 200 in which the second antenna 420 is disposed by a coating process for improving the waterproof property and the weatherproofness.

According to this example embodiment, the heat generated by the electronic components 400 mounted on the upper surface 110 and the lower surface 120 of the board 100 is transferred to the protection member 200 via the through-hole 600s, the thermal via 600g, the heat transfer members 301 and 302, and the like. Then, the heat transferred to the protection member 200 is radiated to the outside.

Accordingly, the heat generated by the electronic components 400 mounted on the upper surface 110 and the lower surface 120 of the board 100 can be radiated in a direction in which a radio wave is radiated by the first antenna 410 and the second antenna 420.

It should be noted that an electric circuit configured so as to include, for example, transceiver and an antenna may be disposed in parallel on the board 100 of the electric circuit system 1. Further, the electric circuits disposed in parallel may be separated by the conductive heat transfer member 301 realized by a conductor, a conductive substance disposed on the surface, or a member containing conductive substance powder. By using such structure, interference between the electric circuits disposed in parallel can be well suppressed.

Example Embodiment 2

Next, an electric circuit system 2 according to a second example embodiment of the present invention will be described. In the electric circuit system 1 according to the first example embodiment shown in FIGS. 1 to 3, the first antenna 410 disposed on the upper surface 110 of the board 100 and the protection member 200 are thermally coupled to each other by the heat transfer member 302.

In contrast, in the electric circuit system 2 according to the second example embodiment of the present invention, the first antenna 410 disposed on the upper surface 110 of a board 102 and a second antenna 422 disposed on the outer surface 243 of a protection member 202 are thermally coupled to each other by heat transfer members 322a and 322b.

Figure 4:
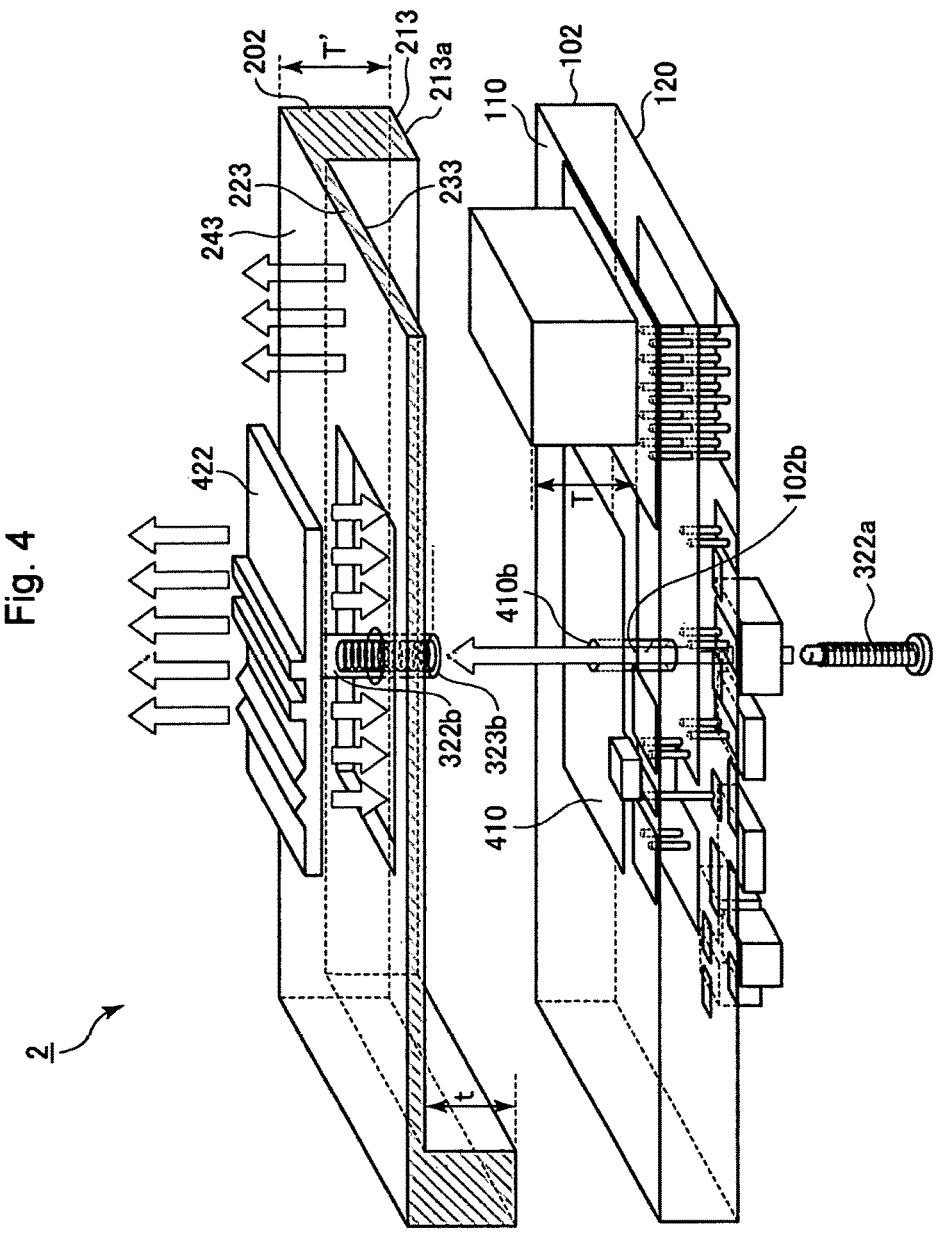
FIG. 4 is a sectional perspective view schematically showing an example of a structure of an electric circuit system according to a second example embodiment of the present invention.

FIG. 4 is a sectional perspective view schematically showing an example of a structure of the electric circuit system 2 according to the second example embodiment of the present invention. As shown in FIG. 4, the electric circuit system 2 according to this example embodiment includes the board 102, the protection member 202 which covers the upper surface 110 that is one of the surfaces of the board 102, and the heat transfer members 322a and 322b by which the board 102 and the protection member 202 are thermally coupled to each other.

For example, the heat transfer member 322a is a metal screw whose thermal conductivity is higher than that of air. Further, for example, the heat transfer member 322b is formed so as to be integrated with the second antenna 422 and has a hollow cylindrical body that extends in a direction in which the second antenna 422 faces to the inside of the electric circuit system 2 when the second antenna 422 is disposed on the outer surface 243 of the protection member 200. Furthermore, an opening edge part 323b of the heat transfer member 322b makes contact with the first antenna 410.

Communication holes 410b and 102b through which a shaft of the heat transfer member 322a can pass but a head part thereof cannot pass are provided to the first antenna 410 and the board 102, respectively. Further, the thread is provided on the inner wall of the heat transfer member 322b so that the shaft of the heat transfer member 322a is engaged with the thread. Accordingly, the tip of the shaft of the heat transfer member 322a is inserted into the communication holes 102b and 410a from the lower surface 120 side of the board 102, the shaft is engaged with the thread on the inner wall of the heat transfer member 322b, and whereby, the second antenna 422 is screwed to the board 102 via the first antenna 410. Furthermore, the opening edge part 323b of the heat transfer member 322b makes contact with the first antenna 410. Therefore, the second antenna 422 and the first antenna 410 are thermally coupled to each other.

Figure 5:
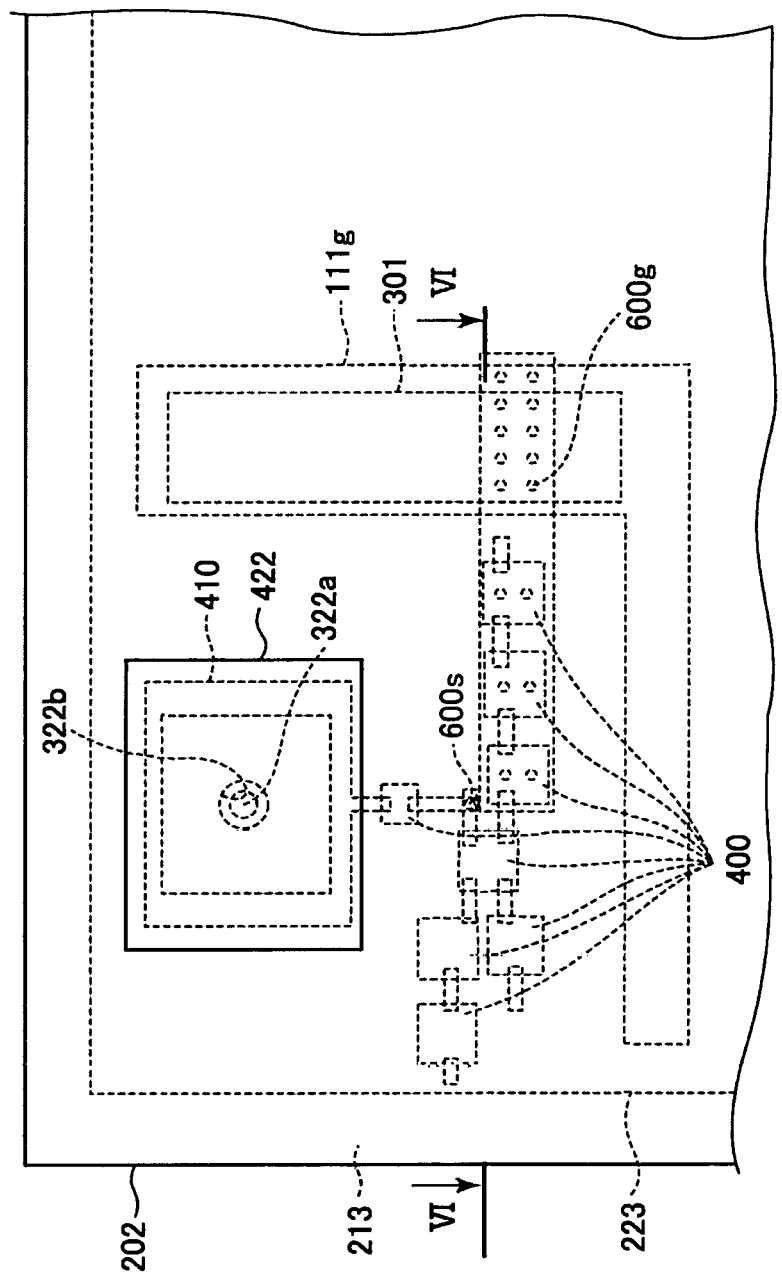
FIG. 5 is a top view of an electric circuit system according to the second example embodiment of the present invention.

FIG. 5 is a top view of the electric circuit system 2 according to the second example embodiment of the present invention. As shown in FIG. 5, the heat transfer member 301 is disposed on the first layer circuit 111g on the upper surface 110 of the board 102 like the first example embodiment shown in FIG. 2.

Figure 6:
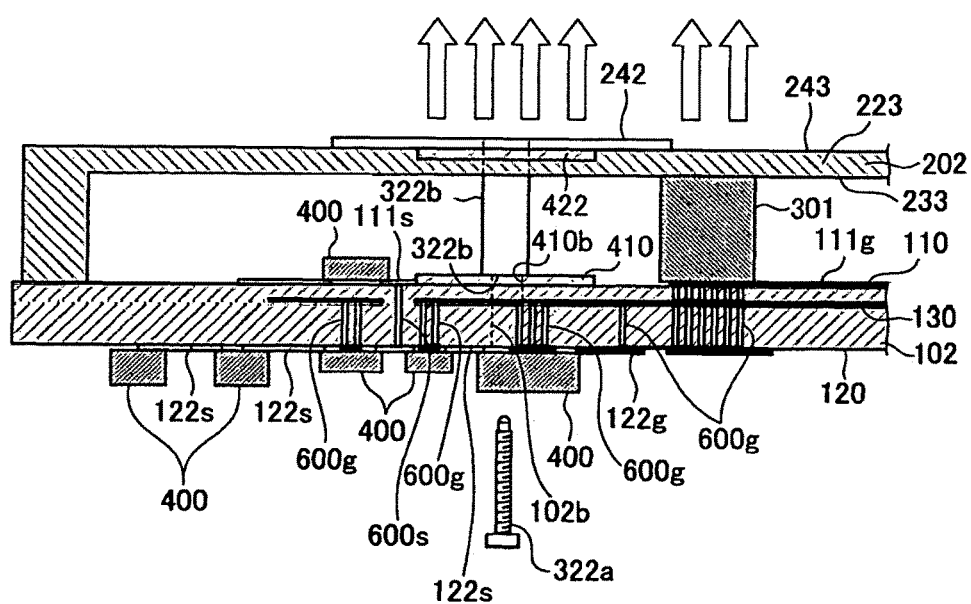
FIG. 6 is a sectional view of a main part of an electric circuit system according to the second example embodiment of the present invention.

FIG. 6 is a sectional view of a main part of the electric circuit system 2 according to the second example embodiment of the present invention. FIG. 6 shows a cross-section along a line VI-VI in FIG. 5. As shown in FIG. 6, the electronic components 400 are mounted on the upper surface 110 and the lower surface 120 of the board 102. Further, the first antenna 410 is disposed on the upper surface 110 of the board 100 and the second antenna 422 is disposed on the outer surface 243 of the protection member 200.

As shown in FIGS. 5 and 6, the heat transfer member 301 and a part of the electronic components 400 are thermally coupled to each other via the first layer circuit 111g, the thermal via 600g, and the second layer circuit 122g. Accordingly, heat generated by a part of the electronic components 400 mentioned above is transferred to the heat transfer member 301.

Then, the heat transferred to the heat transfer member 301 is transferred to the outer surface 243 via a protection member 202 top surface 233 and radiated outside the electric circuit system 2 from the outer surface 243.

Further, the heat transfer member 322b that extends from the second antenna 422 makes contact with the first antenna 410 disposed on the upper surface 110 of the board 102. Accordingly, the second antenna 422 and the first antenna 410 are thermally coupled to each other via the heat transfer member 322b. Accordingly, the heat that is generated by the electronic components 400 other than a part of the electronic components 400 described above and transferred to the first antenna 410 via the second layer circuit 122s, the through-hole 600s, and the first layer circuit 111s is transferred to the second antenna 422 via the heat transfer member 322b.

Then, the heat transferred to the second antenna 422 is radiated outside the electric circuit system 2.

According to this example embodiment, the heat generated by the electronic components 400 mounted on the upper surface 110 and the lower surface 120 of the board 102 is transferred to the protection member 202 and the second antenna 422 via the through-hole 600s, the thermal via 600g, the heat transfer members 301, 322a, 322b, and the like. Then, the heat transferred to the protection member 202 and the second antenna 422 is radiated to the outside.

Accordingly, by using this example embodiment, the heat generated by the electronic components 400 mounted on the upper surface 110 and the lower surface 120 of the board 102 can be radiated in a direction in which the first antenna 410 and the second antenna 422 radiate a radio wave like the first example embodiment.

Example Embodiment 3

Figure 7:
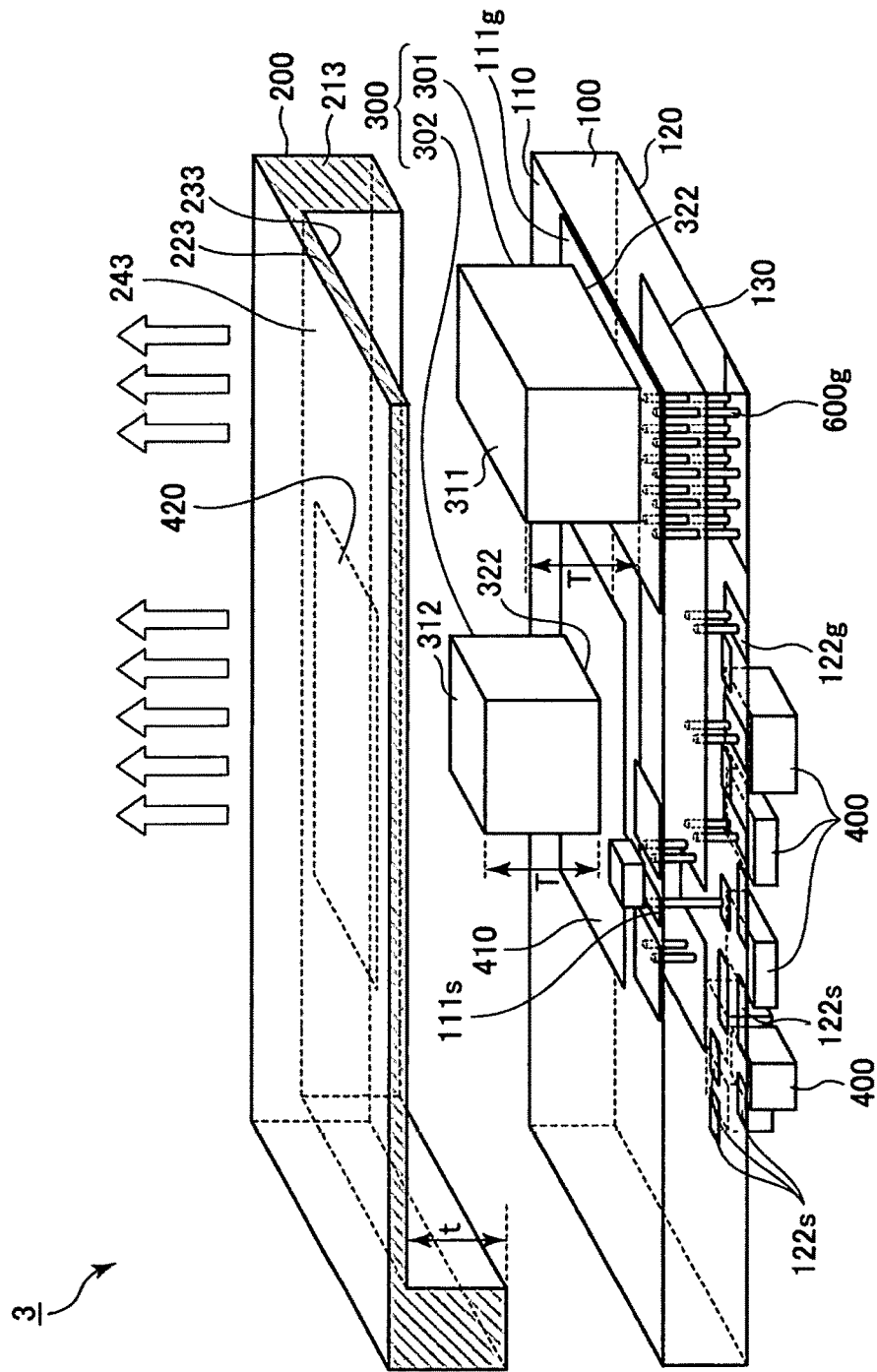
FIG. 7 is a sectional perspective view schematically showing an example of a structure of an electric circuit system according to a third example embodiment of the present invention.

An electric circuit system 3 according to a third example embodiment of the present invention will be described with reference to drawings. FIG. 7 is a sectional perspective view schematically showing an example of a structure of the electric circuit system 3 according to the third example embodiment of the present invention. As shown in FIG. 7, the electric circuit system 3 according to this example embodiment includes the board 100, the protection member 200 which covers the upper surface 110 that is one of the surfaces of the board 100, and the heat transfer member 300 via which the board 100 and the protection member 200 are thermally coupled to each other.

In the electric circuit system 1 according to the first example embodiment shown in FIG. 1, the second antenna 420 is disposed on the outer surface 243 of the protection member 200. In contrast, in the electric circuit system 3 according to this example embodiment shown in FIG. 7, the second antenna 420 is disposed on the top surface 233 of the protection member 200.

The structure other than the above-mentioned structure is similar to the structure shown in FIG. 1. Therefore, the same reference numbers are used for the elements having the same function as the first example embodiment shown in FIG. 1 and the description of the element will be omitted appropriately.

Figure 8:
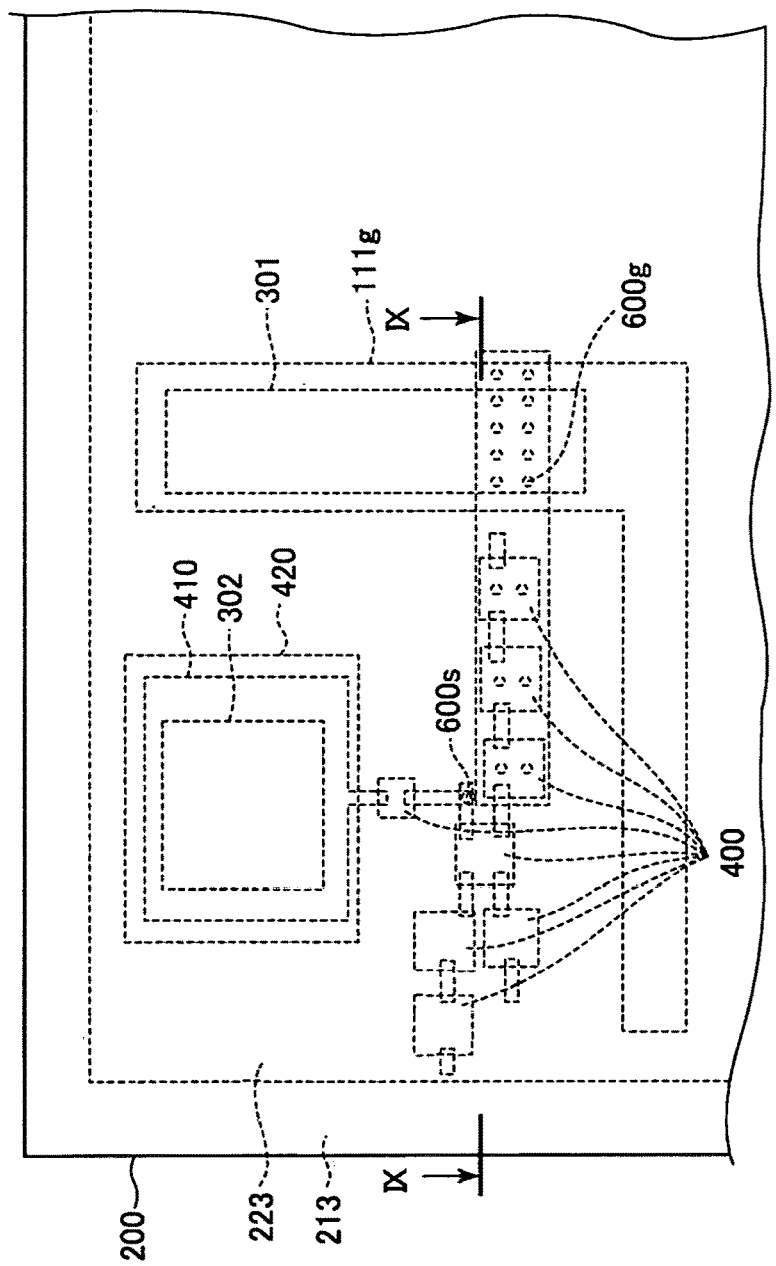
FIG. 8 is a top view of an electric circuit system according to the third example embodiment of the present invention.

FIG. 8 is a top view of the electric circuit system 3 according to the third example embodiment of the present invention. As shown in FIG. 8, the heat transfer member 301 is disposed on the first layer circuit 111g on the upper surface 110 of the board 100. Further, the heat transfer member 302 is disposed on the first antenna 410 disposed on the upper surface 110 of the board 100.

Figure 9:
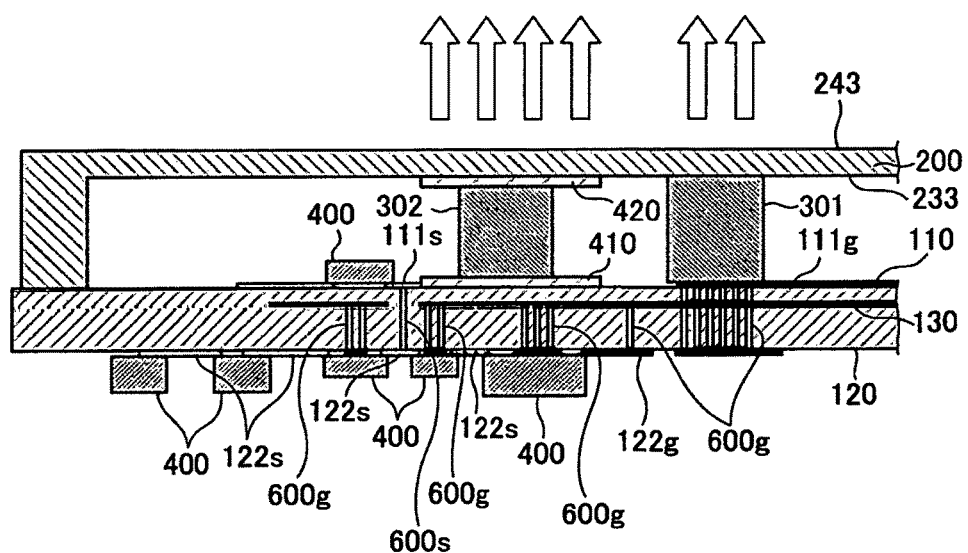
FIG. 9 is a sectional view of a main part of an electric circuit system according to the third example embodiment of the present invention.

FIG. 9 is a sectional view of a main part of the electric circuit system 3 according to the third example embodiment of the present invention. FIG. 9 shows a cross-section along a line IX-IX in FIG. 8. As shown in FIG. 9, the electronic components 400 are mounted on the upper surface 110 and the lower surface 120 of the board 100. Further, the first antenna 410 is disposed on the upper surface 110 of the board 100 and the second antenna 420 is disposed on the top surface 233 of the protection member 200.

Furthermore, as shown in FIGS. 8 and 9, the heat transfer member 302 and each electronic component 400 are thermally coupled to each other via the first antenna 410, the first layer circuit 111s, the through-hole 600s, and the second layer circuit 122s. Accordingly, the heat generated by each electronic component 400 is transferred to the heat transfer member 302. Further, the heat transfer member 301 and each electronic component 400 are thermally coupled to each other via the first layer circuit 111g, the thermal via 600g, and the second layer circuit 122g. Accordingly, the heat generated by each electronic component 400 is transferred to the heat transfer member 301.

Then, the heat transferred to the heat transfer member 302 is transferred to the outer surface 243 via the second antenna 420 and the top surface 233 of the protection member 200 and radiated outside the electric circuit system 3 from the outer surface 243. On the other hand, the heat transferred to the heat transfer member 301 is transferred to the outer surface 243 via the top surface 233 of the protection member 200 and radiated outside the electric circuit system 3 from the outer surface 243.

It should be noted that in the electric circuit system 3 according to this example embodiment, the radio wave is radiated by the first antenna 410 and the second antenna 420 in a direction in which the upper surface 110 of the board 100 faces.

According to this example embodiment, the heat generated by the electronic components 400 mounted on the upper surface 110 and the lower surface 120 of the board 100 is transferred to the protection member 200 via the through-hole 600s, the thermal via 600g, the heat transfer members 301 and 302, the second antenna 420, and the like. The heat transferred to the protection member 200 is radiated to the outside.

Accordingly, the electric circuit system 3 according to this example embodiment has effects similar to those of the electric circuit system 1 according to the first example embodiment.

Example Embodiment 4

Next, an electric circuit system 4 according to a fourth example embodiment of the present invention will be described. In the electric circuit system 1 according to the first example embodiment shown in FIGS. 1 to 3, the first antenna 410 disposed on the upper surface 110 of the board 100 and the protection member 200 are thermally coupled to each other via the heat transfer member 302. Further, the first layer circuit 111g formed on the upper surface 110 of the board 100 and the protection member 200 are thermally coupled to each other via the heat transfer member 301. Then, the heat transferred to the protection member 200 is radiated outside the electric circuit system 1.

Namely, the heat generated by the electronic component 400 mounted on the board 100 is transferred to the protection member 200 via the heat transfer members 301 and 302 and radiated to the outside.

In contrast, in the electric circuit system 4 according to this example embodiment, the heat generated by the electronic component 400 mounted on the board 100 is directly transferred to the protection member 200 from the board 100 and radiated to the outside.

Figure 10:
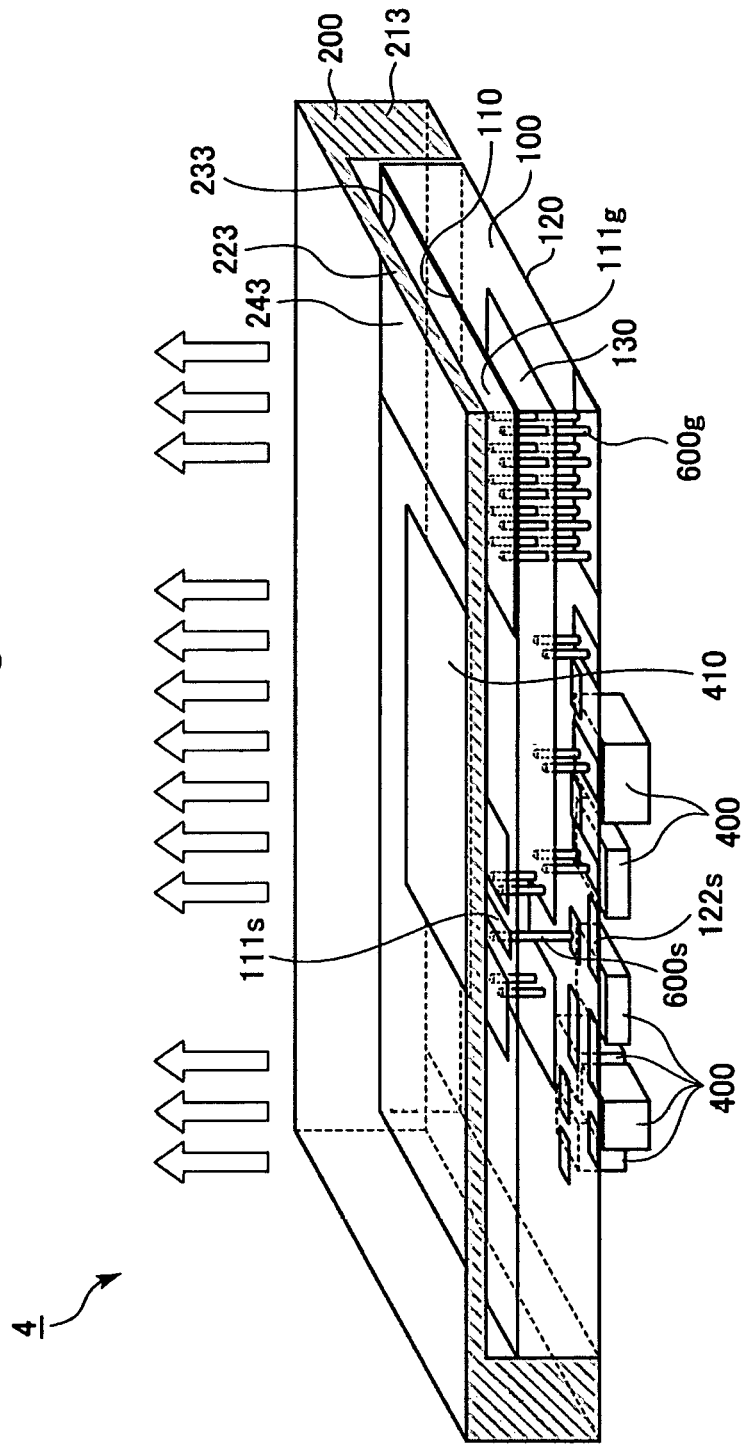
FIG. 10 is a sectional perspective view schematically showing an example of a structure of an electric circuit system according to a fourth example embodiment of the present invention.

FIG. 10 is a sectional perspective view schematically showing an example of a structure of the electric circuit system 4 according to the fourth example embodiment of the present invention. For ease of explanation, in FIG. 10, the upper surface 110 of the board 100 is separated from the top surface 233 of the protection member 200. However, in fact, in the electric circuit system 4 according to this example embodiment, the upper surface 110 of the board 100 is in contact with the top surface 233 of the protection member 200.

Figure 11:
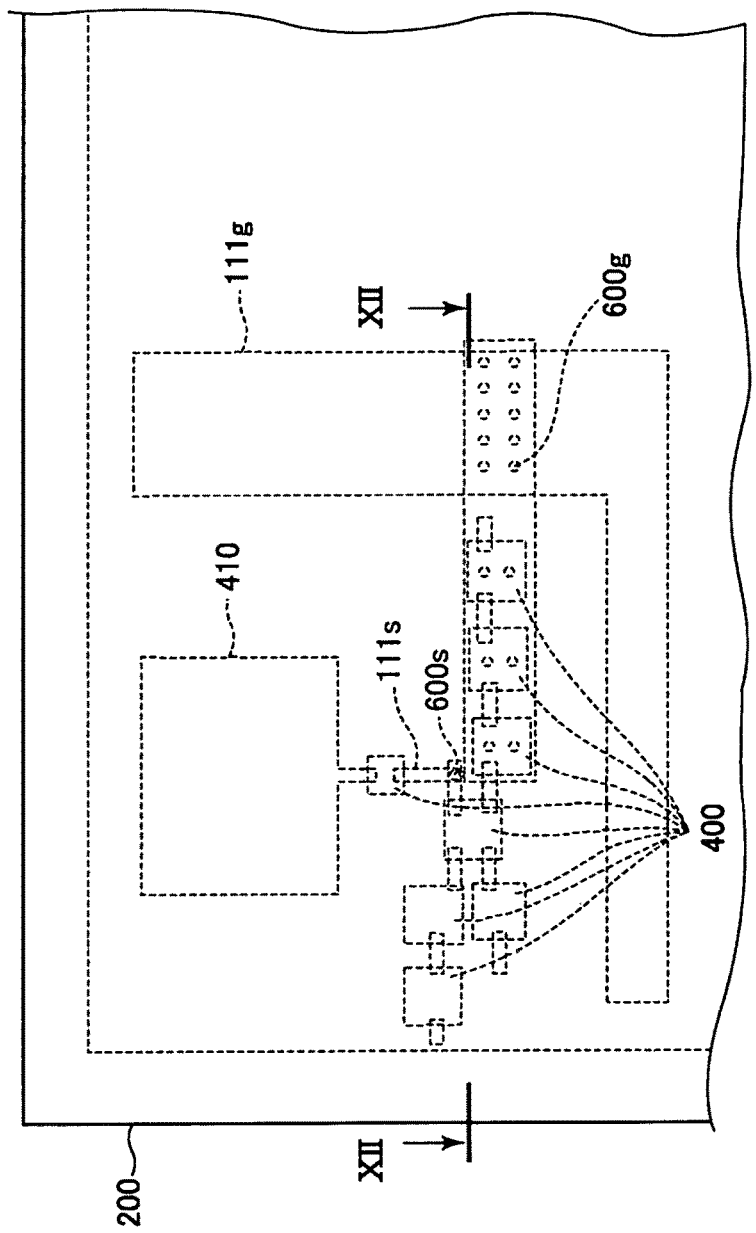
FIG. 11 is a top view of an electric circuit system according to the fourth example embodiment of the present invention.
Figure 12:
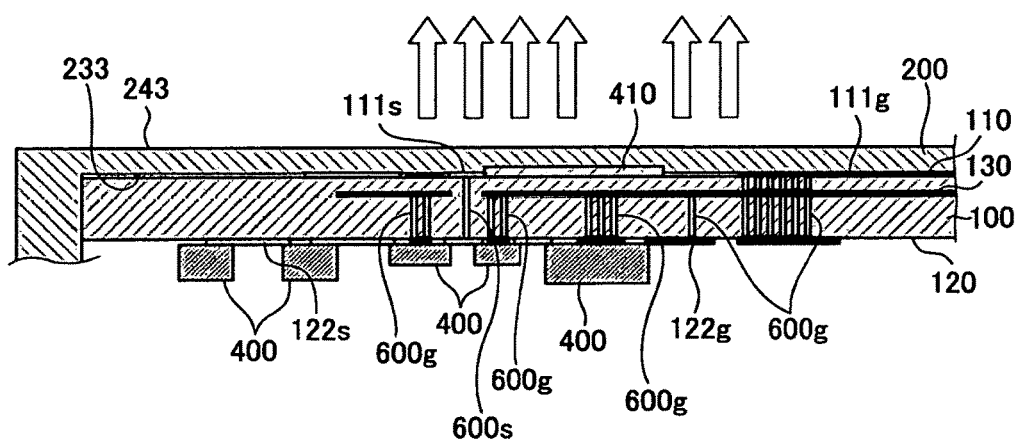
FIG. 12 is a sectional view of a main part of an electric circuit system according to the fourth example embodiment of the present invention.

FIG. 11 is a top view of the electric circuit system 4 according to the fourth example embodiment of the present invention. FIG. 12 is a sectional view of a main part of the electric circuit system 4 according to the fourth example embodiment of the present invention. FIG. 12 shows a cross-section along a line XII-XII in FIG. 11. As shown in FIGS. 11 and 12, the electronic components 400 are mounted on the lower surface 120 of the board 100. Further, the first antenna 410 is disposed on the upper surface 110 of the board 100. Accordingly, in the electric circuit system 4 according to this example embodiment, the radio wave is radiated by the first antenna 410 in a direction in which the upper surface 110 of the board 100 faces. Further, as shown in FIG. 12, in the electric circuit system 4 according to this example embodiment, the upper surface 110 of the board 100 is in contact with the top surface 233 of the protection member 200.

According to this example embodiment, the heat generated by the electronic components 400 mounted on the lower surface 120 of the board 100 is transferred to the protection member 200 via the through-hole 600s and the thermal via 600g. The heat transferred to the protection member 200 is radiated to the outside.

Accordingly, the electric circuit system 4 according to this example embodiment has effects similar to those of the electric circuit system 1 according to the first example embodiment.

Example Embodiment 5

Next, an electric circuit system 5 according to a fifth example embodiment of the present invention will be described. In the electric circuit system 4 according to the fourth example embodiment shown in FIGS. 10 to 12, the upper surface 110 of the board 100 is in contact with the top surface 233 of the protection member 200. Accordingly, the heat generated by the electronic components 400 mounted on the board 100 is directly transferred to the protection member 200 from the board 100 and radiated to the outside.

In the electric circuit system 5 according to this example embodiment, in the plate-shaped portion 223 of a protection member 205, a through-hole 245 is provided between the top surface 233 and the outer surface 243. The heat generated by the electronic components 400 mounted on a board 105 is radiated outside the electric circuit system 5 via the protection member 205 and by the convection of air in the through-hole 245. It should be noted that although, in general, a radome is made from plastic, the protection member 205 according to this example embodiment is made from for example, metal whose thermal conductivity is higher than that of plastic (for example, ABS (Acrylonitrile-Butadiene-Styrene) or fiber reinforced plastic (FRP).

Figure 13:
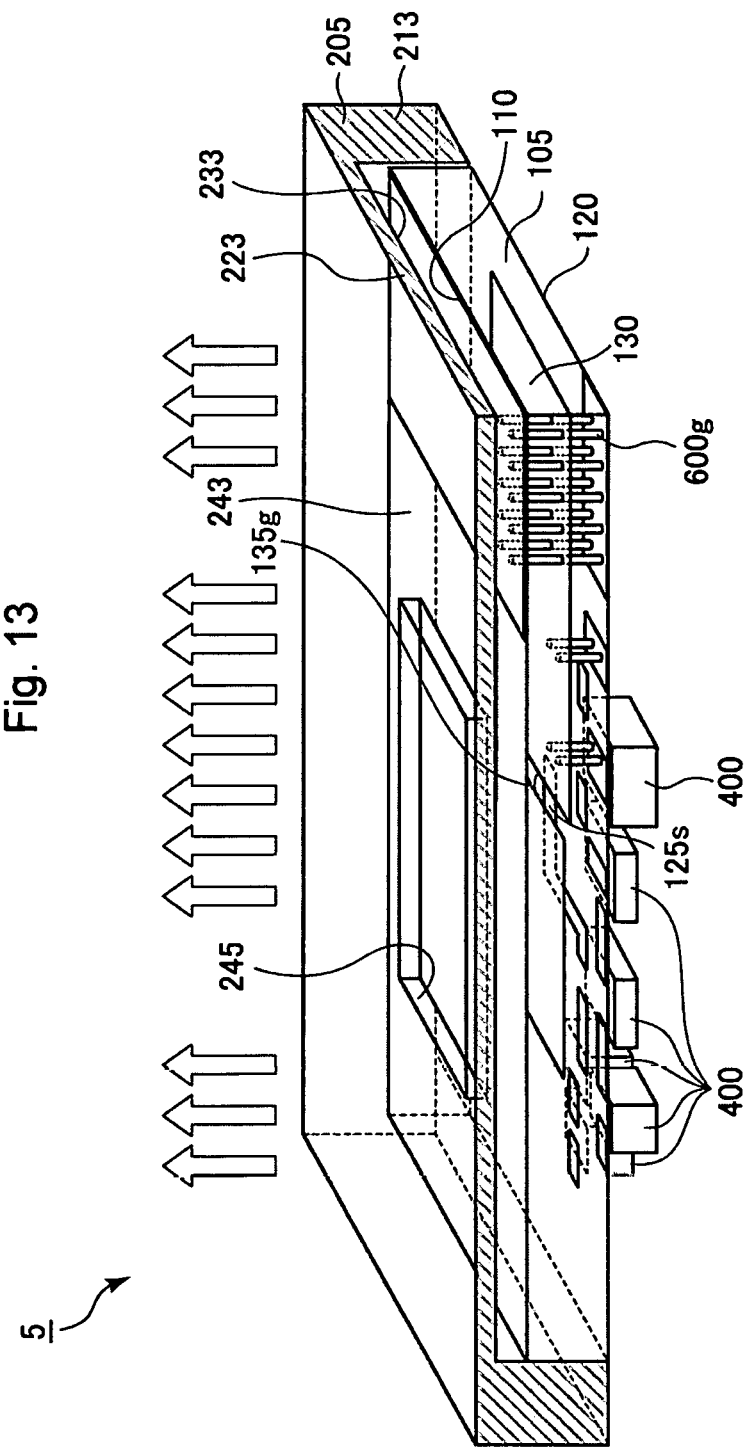
FIG. 13 is a sectional perspective view schematically showing an example of a structure of an electric circuit system according to the fourth example embodiment of the present invention.

FIG. 13 is a sectional perspective view schematically showing an example of a structure of the electric circuit system 5 according to the fifth example embodiment of the present invention. For ease of explanation, in FIG. 13, the upper surface 110 of the board 105 is separated from the top surface 233 of the protection member 205. However, in fact, in the electric circuit system 5 according to this example embodiment, the upper surface 110 of the board 105 is in contact with the top surface 233 of the protection member 205.

Figure 14:
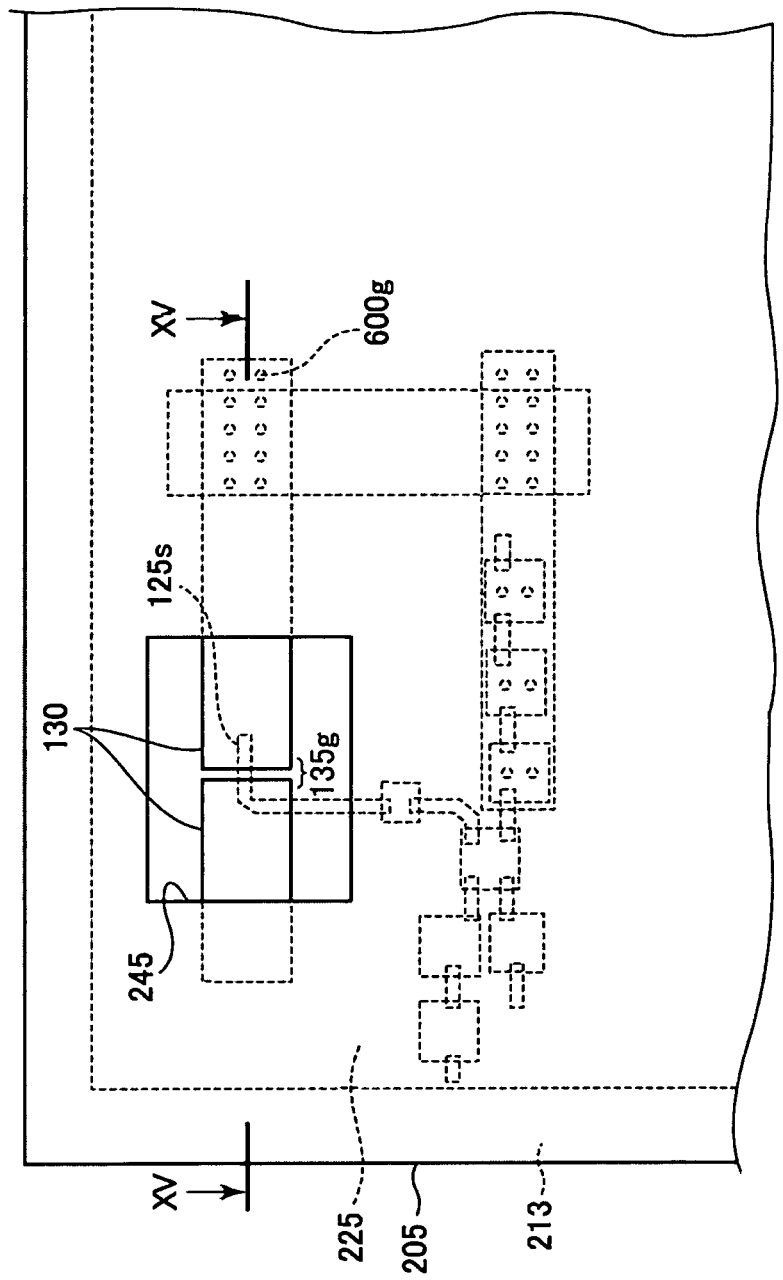
FIG. 14 is a top view of an electric circuit system according to a fifth example embodiment of the present invention.
Figure 15:
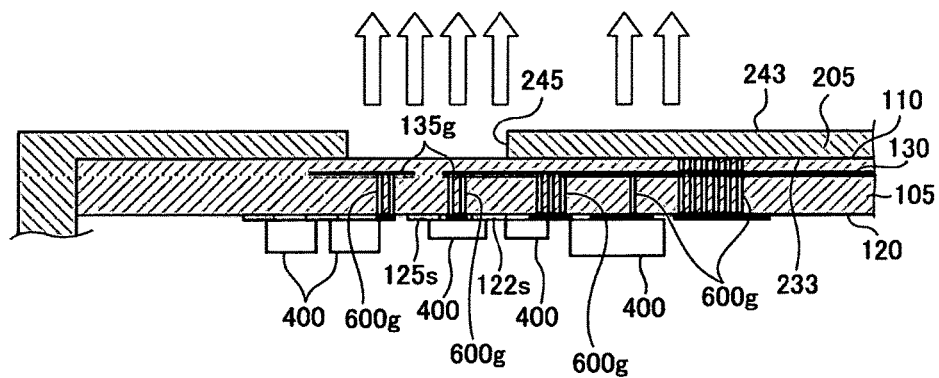
FIG. 15 is a sectional view of a main part of an electric circuit system according to the fifth example embodiment of the present invention.

FIG. 14 is a top view of the electric circuit system 5 according to the fifth example embodiment of the present invention. FIG. 15 is a sectional view of a main part of the electric circuit system 5 according to the fifth example embodiment of the present invention. FIG. 15 shows a cross-section along a line XV-XV in FIG. 14.

In an example shown in FIGS. 13 to 15, a microstrip line 125s to which an electric power is supplied by the electronic components 400 is provided on the lower surface 120 of the board 105. Further, a ground slot 135g is provided in a predetermined area including an area facing the microstrip line 125s on the lower surface 120 in the ground layer 130 formed as an interlayer sandwiched between the upper surface 110 and the lower surface 120 of the board 105. Furthermore, the through-hole 245 between the top surface 233 and the outer surface 243 of the plate-shaped portion 223 of the protection member 205 is provided in a predetermined area including an area opposite to an area on the lower surface 120 of the board 105 in which the microstrip line 125s is mounted. The predetermined area including the area opposite to the area on the lower surface 120 of the board 105 in which the microstrip line 125s is mounted is exposed through the through-hole 245.

It should be noted that a shape and dimensions of the microstrip line 125s, the ground slot 135g, and the through-hole 245, a position of a feeding point, and the like are determined according to for example, the frequency of the radio wave transmitted and received by the electric circuit system 5.

According to this example embodiment, a part of the heat generated by the electronic components 400 mounted on the lower surface 120 of the board 105 is transferred to the protection member 205 via the thermal via 600g. Then, the heat transferred to the protection member 205 is radiated to the outside. Further, remains of the heat generated by the electronic components 400 are transferred to the upper surface 110 through the inside of the board 105 and radiated outside the electric circuit system 5 via the protection member 205 made from metal with a high thermal conductivity and by the convection of air in the through-hole 245 of the protection member 205.

Accordingly, the electric circuit system 5 according to this example embodiment has effects similar to those of the electric circuit system 1 according to the first example embodiment.

Example Embodiment 6

Figure 16:
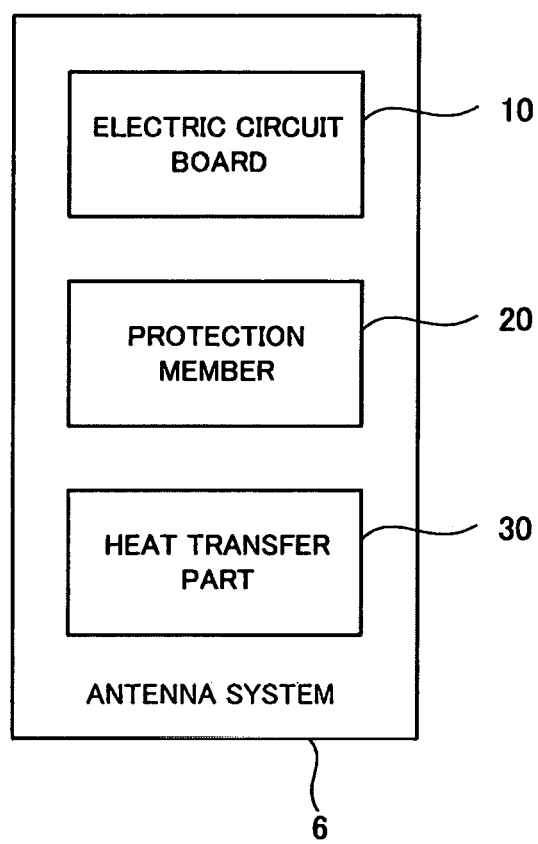
FIG. 16 is an explanatory drawing showing an example of a configuration of an antenna system according to a sixth example embodiment of the present invention.

Next, an antenna system 6 according to a sixth example embodiment of the present invention will be described with reference to a drawing. FIG. 16 is an explanatory drawing showing an example of a configuration of the antenna system 6 according to the sixth example embodiment of the present invention. As shown in FIG. 16, the antenna system 6 according to the sixth example embodiment of the present invention includes an electric circuit board 10, a protection member 20, and a heat transfer part 30.

The electronic component is mounted on the electric circuit board 10 and the electric circuit board 10 includes an antenna formed on one of surfaces of the electric circuit board. The protection member 20 covers one of surfaces of the electric circuit board 10. The heat transfer part 30 transfers the heat generated by the electronic component mounted on the electric circuit board 10 to the protection member 20.

It should be noted that the electric circuit board 10 corresponds to the board 100 or the board 102 in the first to fourth example embodiments. Further, the protection member 20 corresponds to the protection member 200 or the protection member 202 in the first to fourth example embodiments. The heat transfer part 30 corresponds to the heat transfer member 300, the heat transfer member 322a, the heat transfer member 322b, the through-hole 600s, or the thermal via 600g in the first to fourth example embodiments. The electronic component corresponds to the electronic component 400 in the first to fourth example embodiments.

According to this example embodiment, the heat generated by the electronic component can be well radiated to the outside of the housing of the antenna system.

Example Embodiment 7

Figure 17:
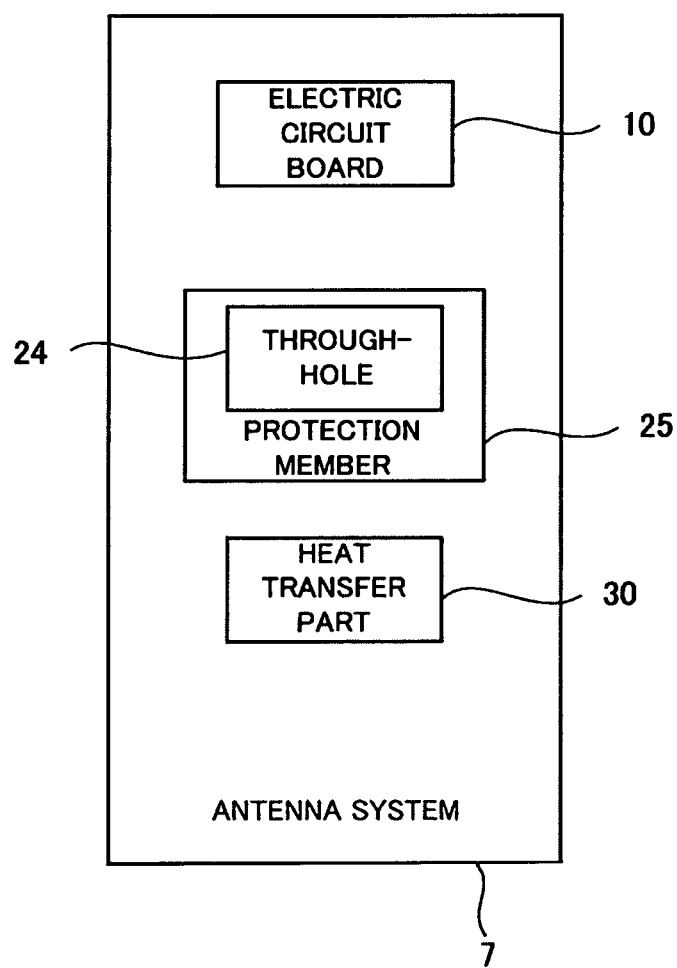
FIG. 17 is an explanatory drawing showing an example of a configuration of an antenna system according to a seventh example embodiment of the present invention.

Next, an antenna system 7 according to a seventh example embodiment of the present invention will be described with reference to a drawing. FIG. 17 is an explanatory drawing showing an example of a configuration of the antenna system 7 according to the seventh example embodiment of the present invention. As shown in FIG. 17, the antenna system 7 according to the seventh example embodiment of the present invention includes the electric circuit board 10, a protection member 25, and the heat transfer part 30.

An antenna is formed on the electric circuit board 10 and the electronic circuit board 10 having a surface on which an electronic component is mounted. The protection member 25 covers at least part of another surface of the electric circuit board 10. The heat transfer part 30 transfers the heat generated by the electronic component mounted on the electric circuit board 10.

At least part of heat generated by the electronic component is transferred to a side of the another surface via the heat transfer part 30. Besides, the protection member 25 is provided with a through hole 24 that exposes the another surface of the electric circuit board 10 for releasing the heat, which is transferred to the another surface, to outside.

It should be noted that the electric circuit board 10 corresponds to the board 105 in the fifth example embodiment. Further, the protection member 25 corresponds to the protection member 205 in the fifth example embodiment. The through-hole 24 corresponds to the through-hole 245 in the fifth example embodiment. The heat transfer part 30 corresponds to the thermal via 600g in the fifth example embodiment.

According to this example embodiment, the heat generated by the electronic component can be well radiated to the outside of the housing of the antenna system.

It should be noted that in each example embodiment described above, it is desirable that each protection member is made of a material with a higher thermal conductivity. According to such structure, the heat generated by the electronic component can be well radiated to the outside of the housing of the antenna system.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-195176, filed on Sep. 25, 2014, the disclosure of which is incorporated herein in its entirety by reference.

REFERENCE SIGNS LIST 1, 2, 3, 4, and 5 electric circuit system
6 and 7 antenna system
10 electric circuit board
20 and 25 protection member
24 through-hole
30 heat transfer part
100 and 102 board
102b and 410b communication hole
110 upper surface
111s and 111g first layer circuit
120 lower surface
122s and 122g second layer circuit
125s microstrip line
130 ground layer
135g ground slot
200 and 205 protection member
213 leg portion
223 plate-shaped portion
233 top surface
243 outer surface
245 through-hole
300, 301, 302, 322a, and 322b heat transfer member
323b opening edge part
311 and 312 upper surface
321 and 322 lower surface
410 first antenna
420 second antenna
600s through-hole
600g thermal via

The invention claimed is:

1. An antenna system comprising:
an electric circuit board on which an electronic component is mounted, the electric circuit board including an antenna formed on one of surfaces of the electric circuit board;
a protection member covering the one of surfaces of the electric circuit board;
a heat transfer part which transfers heat generated by the electronic component mounted on the electric circuit board to the protection member, and
a sub resonator provided on an outer surface of the protection member.

2. An antenna system comprising:
an electric circuit board on which an antenna is formed, the electric circuit board having a surface on which an electronic component is mounted;
a protection member covering at least part of another surface of the electric circuit board; and
a heat transfer part which transfer heat generated by the electronic component mounted on the electric circuit board,
wherein
at least part of heat generated by the electronic component is transferred to a side of the another surface via the heat transfer part and
the protection member is provided with a through hole that exposes the another surface of the electric circuit board for releasing the heat, which is transferred to the another surface, to outside.

3. The antenna system according to claim 2, wherein the antenna formed on the electric circuit board is a slot antenna.

4. The antenna system according to claim 2, wherein the protection member is made of a material with a higher thermal conductivity than that of plastic.

5. The antenna system according to claim 1, wherein the heat transfer part includes a resin member formed in such a way that the one surface of the electric circuit board and the protection member are thermally coupled to each other.

6. The antenna system according to claim 1 wherein
resonance frequency of the sub resonator is equal to that of the antenna formed on the electric circuit board,
the heat transfer part includes a connection member by which the one surface of the electric circuit board and the sub resonator are thermally coupled to each other, at least part of heat generated by the electronic component is transferred to the sub resonator via the connection member, and the heat transferred to the sub resonator is released to outside.

7. The antenna system according to claim 1, wherein the heat transfer part is provided in the electric circuit board and includes a via provided so as to transfer heat to a surface facing the protection member.

8. The antenna system according to claim 2, wherein a surface of the electric circuit board which faces the protection member and the protection member are in contact with each other and thermally coupled to each other.

9. The antenna system according to claim 2, wherein the heat transfer part is provided in the electric circuit board and includes a via provided so as to transfer heat to a surface facing the protection member.

* * * * *